United States Patent
Nakashima et al.

(10) Patent No.: US 7,923,627 B2
(45) Date of Patent: Apr. 12, 2011

(54) PHOTOVOLTAIC ELEMENT, PHOTOVOLTAIC MODULE COMPRISING PHOTOVOLTAIC ELEMENT, AND METHOD OF FABRICATING PHOTOVOLTAIC ELEMENT

(75) Inventors: Takeshi Nakashima, Kobe (JP); Eiji Maruyama, Katano (JP)

(73) Assignee: Sanyo Electric Co., Ltd., Osaka (JP)

( * ) Notice: Subject to any disclaimer, the term of this patent is extended or adjusted under 35 U.S.C. 154(b) by 695 days.

(21) Appl. No.: 11/717,194

(22) Filed: Mar. 13, 2007

(65) Prior Publication Data

US 2007/0215196 A1    Sep. 20, 2007

(30) Foreign Application Priority Data

Mar. 17, 2006  (JP) ................. 2006-073858

(51) Int. Cl.
  *H01L 31/0224* (2006.01)
  *H01L 31/028* (2006.01)
  *H01L 31/036* (2006.01)
(52) U.S. Cl. .......... 136/256; 136/258; 136/252; 438/76; 438/57
(58) Field of Classification Search ........................ None
  See application file for complete search history.

(56) References Cited

U.S. PATENT DOCUMENTS

| | | | |
|---|---|---|---|
| 7,214,872 B2 * | 5/2007 | Maruyama et al. ............ | 136/258 |
| 2001/0020486 A1 * | 9/2001 | Tsuge ............................ | 136/251 |
| 2003/0062081 A1 | 4/2003 | Maruyama et al. | |
| 2004/0177878 A1 | 9/2004 | Maruyama | |

FOREIGN PATENT DOCUMENTS

| JP | 2005-175160 | 6/2005 |
|---|---|---|
| WO | 2005071760 | 8/2005 |

OTHER PUBLICATIONS

Adurodija et al., Effects of Stress on teh Structure of Indium-Tin-Oxide Thin Films Grown by Pulsed Laser Deposition, Journal of Materials Science: Materials in Electronics, vol. 12, pp. 57-61, 2001.*
Izumi et al., Electrical and Structural Properties of Indium Tin Oxide Films prepared by Pulsed Laser Deposiiton, Journal of Applied Physics, vol. 91, No. 3, pp. 1213-1218, 2002.*
Neernick et al. Depth Profiling of Thin ITO Film by Grazing Incidence X-ray Diffraction, Thin Solid Films, vol. 278, pp. 12-17, 1996.*
Abe et al., Amorphous Indium Tngsten Oxide Films Prepared by DC Magnetron Sputtering, Journal of Materials Science, vol. 40, pp. 1611-1614, 2005.*
Extended European Search Report, dated Dec. 19, 2009.

* cited by examiner

*Primary Examiner* — Jennifer K Michener
*Assistant Examiner* — Jayne Mershon
(74) *Attorney, Agent, or Firm* — NDQ&M Watchstone LLP

(57) ABSTRACT

A photovoltaic element capable of improving weather resistance is obtained. This photovoltaic element includes a photoelectric conversion layer, a first transparent conductive film formed on a surface of the photoelectric conversion layer closer to an incidence side and including a first indium oxide layer having (222) orientation and two X-ray diffraction peaks, and a second transparent conductive film formed on a surface of the photoelectric conversion layer opposite to the incidence side and including a second indium oxide layer having (222) orientation and one X-ray diffraction peak.

16 Claims, 4 Drawing Sheets

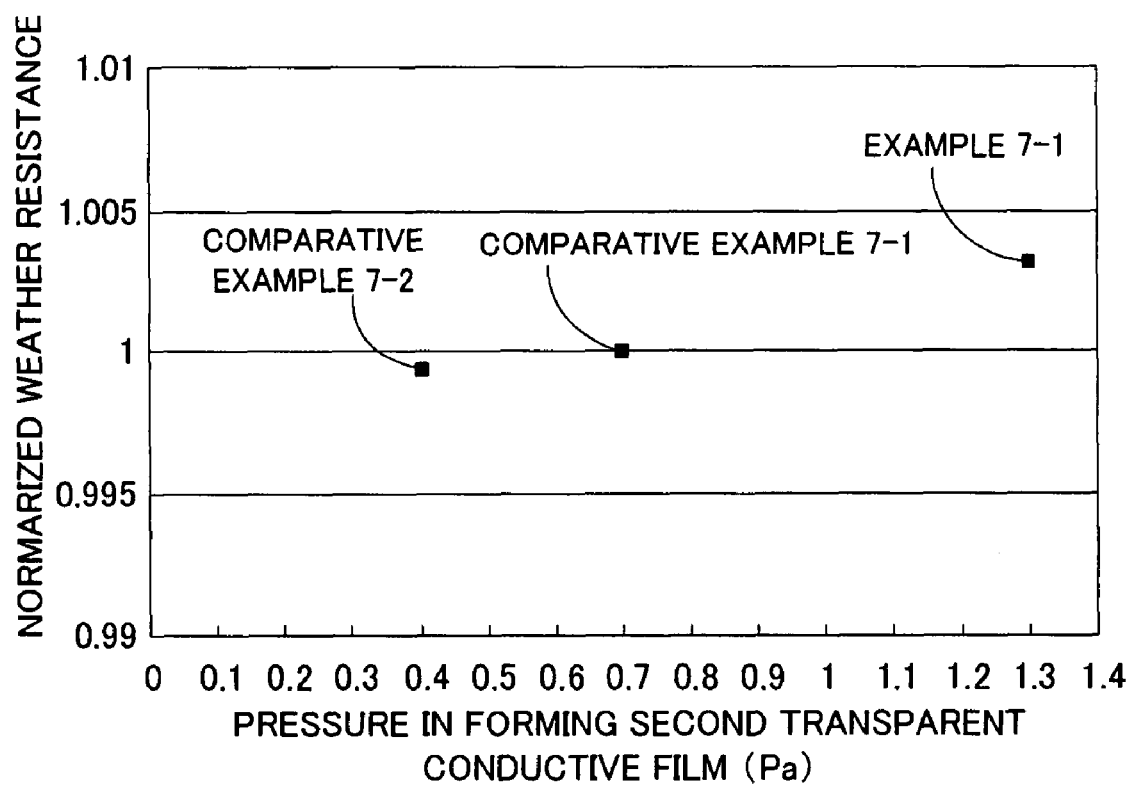

PHOTOVOLTAIC ELEMENT, PHOTOVOLTAIC MODULE COMPRISING PHOTOVOLTAIC ELEMENT, AND METHOD OF FABRICATING PHOTOVOLTAIC ELEMENT

BACKGROUND OF THE INVENTION

1. Field of the Invention

The present invention relates to a photovoltaic element, a photovoltaic module comprising the photovoltaic element, and a method of fabricating the photovoltaic element, and more particularly, it relates to a photovoltaic element comprising a transparent conductive film including an indium oxide layer, a photovoltaic module comprising the photovoltaic element, and a method of fabricating the photovoltaic element.

2. Description of the Background Art

A photovoltaic element comprising a transparent conductive film including an indium oxide layer is known in general as disclosed in Japanese Patent Laying-Open No. 2004-281586, for example.

In the aforementioned Japanese Patent Laying-Open No. 2004-281586, there is disclosed the photovoltaic element (photovoltaic element) comprising a photoelectric conversion layer and the transparent conductive film formed on a surface of the photoelectric conversion layer and consisting of an indium tin oxide (ITO) layer having two X-ray diffraction peaks. In the photovoltaic element, the two X-ray diffraction peaks of the indium tin oxide layer include a peak on a low angle side and a peak on a high angle side having an intensity level higher than the peak on the low angle side.

In the photovoltaic element disclosed in the aforementioned Japanese Patent Laying-Open No. 2004-281586, the transparent conductive film is so formed that the indium tin oxide layer has the two X-ray diffraction peaks of the peak on the low angle side and the peak on the high angle side having the intensity level higher than the peak on the low angle side, whereby the resistance of the transparent conductive film can be reduced as compared with a case where the indium oxide layer has only one X-ray diffraction peak. In addition, the transparent conductive film is formed in the aforementioned manner, light absorption loss of the transparent conductive film can be reduced as compared with the case where the indium oxide layer has only one X-ray diffraction peak. In the photovoltaic element (photovoltaic element), it is known that the transparent conductive film having low resistance and low light absorption loss is effective in increasing the cell output (Pmax) of the photovoltaic element. In the photovoltaic element disclosed in the aforementioned Japanese Patent Laying-Open No. 2004-281586, the resistance and the light absorption loss of the transparent conductive film can be reduced as compared with the case where the indium oxide layer has only one X-ray diffraction peak, whereby the cell output (Pmax) of the photovoltaic element can be increased.

In the photovoltaic element disclosed in the aforementioned Japanese Patent Laying-Open No. 2004-281586, however, sufficient studies on weather resistance have not been made. Thus, it is disadvantageously difficult to improve the weather resistance.

SUMMARY OF THE INVENTION

The present invention has been proposed in order to solve the aforementioned problem, and an object of the present invention is to provide a photovoltaic element capable of improving weather resistance, a photovoltaic module comprising the photovoltaic element, and a method of fabricating the photovoltaic element.

In order to attain the aforementioned object, a photovoltaic element according to a first aspect of the present invention comprises a photoelectric conversion layer, a first transparent conductive film formed on a surface of the photoelectric conversion layer closer to an incidence side and including a first indium oxide layer having (222) orientation and two X-ray diffraction peaks, and a second transparent conductive film formed on a surface of the photoelectric conversion layer opposite to the incidence side and including a second indium oxide layer having (222) orientation and one X-ray diffraction peak.

In the photovoltaic element according to the first aspect, as hereinabove described, the first transparent conductive film including the first indium oxide layer having (222) orientation and the two X-ray diffraction peaks is provided on the surface of the photoelectric conversion layer closer to the incidence side, and the second transparent conductive film including the second indium oxide layer having (222) orientation and the one X-ray diffraction peak is provided on the surface of the photoelectric conversion layer opposite to the incidence side, whereby warping can be inhibited from occurring in the photovoltaic element even in a case where the temperature of the photovoltaic element is increased by light incidence, thereby allowing improvement of weather resistance. Consequently, the photovoltaic element capable of suppressing reduction in cell output (Pmax) after a lapse of a long time by the improvement of weather resistance can be obtained. The aforementioned effect has been confirmed by experiments described later.

In the aforementioned photovoltaic element according to the first aspect, the X-ray diffraction peak of the second indium oxide layer preferably has an angle 2θ (θ: X-ray diffraction angle) in the vicinity of 30.6 degrees. According to this structure, weather resistance can be improved as compared with a case where the X-ray diffraction peak of the second indium oxide layer has two diffraction peaks. This effect has also been confirmed by the experiments described later.

In the aforementioned photovoltaic element according to the first aspect, the two X-ray diffraction peaks of the first indium oxide layer are preferably constituted by a first peak on a low angle side having an angle 2θ (θ: X-ray diffraction angle) in the vicinity of 30.1 degrees, and a second peak on a high angle side with a peak intensity level lower than the first peak, having an angle 2θ (θ: X-ray diffraction angle) in the vicinity of 30.6 degrees. In a case where the angles 2θ (θ: X-ray diffraction angle) of the first peak and the second peak are in the vicinity of 30.1 degrees and 30.6 degrees, respectively, and the first peak on the low angle side has the peak intensity level higher than the second peak, weather resistance can be improved. This effect has also been confirmed by the experiments described later.

In this case, the intensity ratio between the first peak and the second peak of the first indium oxide layer is preferably at least 1. According to this structure, weather resistance can be improved as compared with a case where the intensity ratio between the first peak and the second peak of the indium oxide layer is less than 1. This effect has also been confirmed by the experiments described later.

In the aforementioned structure in which the intensity ratio between the first peak and the second peak of the first indium oxide layer is at least 1, the intensity ratio between the first peak and the second peak of the first indium oxide layer is preferably at most 2. According to this structure, a cell output (Pmax) can be increased. This effect has also been confirmed by the experiments described later.

In the aforementioned photovoltaic element according to the first aspect, the first indium oxide layer and the second indium oxide layer preferably include W. According to this structure, in the photovoltaic element comprising the first transparent conductive film and the second transparent conductive film consisting of the indium oxide layer including W (IWO layer), weather resistance can be improved.

The aforementioned photovoltaic element according to the first aspect may further comprise a first semiconductor layer formed thereon with the first transparent conductive film and consisting of at least either an amorphous semiconductor or a microcrystalline semiconductor, a first collector formed on a surface of the first transparent conductive film, a second semiconductor layer formed thereon with the second transparent conductive film and consisting of at least either an amorphous semiconductor or a microcrystalline semiconductor, and a second collector formed on a surface of the second transparent conductive film.

In the aforementioned photovoltaic element according to the first aspect, the first indium oxide layer and the second indium oxide layer preferably include Sn. According to this structure, in the photovoltaic element comprising the first transparent conductive film and the second transparent conductive film consisting of the indium oxide layer including Sn (ITO layer), weather resistance can be improved.

A photovoltaic module according to a second aspect of the present invention comprises a photoelectric conversion layer, a plurality of photovoltaic elements, each of which including a first transparent conductive film formed on a surface of the photoelectric conversion layer closer to an incidence side and including a first indium oxide layer having (222) orientation and two X-ray diffraction peaks, and a second transparent conductive film formed on a surface of the photoelectric conversion layer opposite to the incidence side and including a second indium oxide layer having (222) orientation and one X-ray diffraction peak, a transparent surface protector arranged on a surface of the first transparent conductive film closer to the incidence side, and a resin film arranged on a surface of the second transparent conductive film opposite to the incidence side.

In the photovoltaic module according to the second aspect, as hereinabove described, the first transparent conductive film including the first indium oxide layer having (222) orientation and the two X-ray diffraction peaks is provided on the surface of the photoelectric conversion layer closer to the incidence side, and the second transparent conductive film including the second indium oxide layer having (222) orientation and the one X-ray diffraction peak is provided on the surface of the photoelectric conversion layer opposite to the incidence side, whereby warping can be inhibited from occurring in the photovoltaic element even in a case where the temperature of the photovoltaic element is increased by light incidence, thereby allowing improvement of weather resistance. Consequently, the photovoltaic module capable of suppressing reduction in cell output (Pmax) after a lapse of a long time by the improvement of weather resistance can be obtained.

In the aforementioned photovoltaic module according to the second aspect, the X-ray diffraction peak of the second indium oxide layer preferably has an angle $2\theta$ ($\theta$: X-ray diffraction angle) in the vicinity of 30.6 degrees. According to this structure, weather resistance can be improved as compared with a case where the X-ray diffraction peak of the second indium oxide layer has two diffraction peaks.

In the aforementioned photovoltaic module according to the second aspect, the two X-ray diffraction peaks of the first indium oxide layer are preferably constituted by a first peak on a low angle side having an angle $2\theta$ ($\theta$: X-ray diffraction angle) in the vicinity of 30.1 degrees and a second peak on a high angle side with a peak intensity level lower than the first peak, having an angle $2\theta$ ($\theta$: X-ray diffraction angle) in the vicinity of 30.6 degrees. In a case where the angles $2\theta$ ($\theta$: X-ray diffraction angle) of the first peak and the second peak are in the vicinity of 30.1 degrees and 30.6 degrees, respectively, and the first peak on the low angle side has the peak intensity level higher than the second peak, weather resistance can be improved.

In this case, the intensity ratio between the first peak and the second peak of the first indium oxide layer is at least 1. According to this structure, weather resistance can be improved as compared with a case where the intensity ratio between the first peak and the second peak of the indium oxide layer is less than 1.

In the aforementioned structure in which the intensity ratio between the first peak and the second peak of the first indium oxide layer is at least 1, the intensity ratio between the first peak and the second peak of the first indium oxide layer is preferably at most 2. According to this structure, a cell output (Pmax) can be increased.

In the aforementioned photovoltaic module according to the second aspect, the first indium oxide layer and the second indium oxide layer preferably include W. According to this structure, in the photovoltaic module comprising the photovoltaic element including the first transparent conductive film and the second transparent conductive film consisting of the indium oxide layer including W (IWO layer), weather resistance can be improved.

The aforementioned photovoltaic module according to the second aspect may further comprise a first semiconductor layer formed thereon with the first transparent conductive film and consisting of at least either an amorphous semiconductor or a microcrystalline semiconductor, a first collector formed on a surface of the first transparent conductive film, a second semiconductor layer formed thereon with the second transparent conductive film and consisting of at least either an amorphous semiconductor or a microcrystalline semiconductor, and a second collector formed on a surface of the second transparent conductive film.

In the aforementioned photovoltaic module according to the second aspect, the first indium oxide layer and the second indium oxide layer preferably include Sn. According to this structure, in the photovoltaic element comprising the first transparent conductive film and the second transparent conductive film consisting of the indium oxide layer including Sn (ITO layer), weather resistance can be improved.

A method of fabricating a photovoltaic element according to a third aspect of the present invention comprises steps of forming a photoelectric conversion layer, forming a first transparent conductive film including a first indium oxide layer having (222) orientation and two X-ray diffraction peaks on a surface of the photoelectric conversion layer closer to an incidence side by ion plating, and forming a second transparent conductive film including a second indium oxide layer having (222) orientation and one X-ray diffraction peak on a surface of the photoelectric conversion layer opposite to the incidence side by ion plating.

In the method of fabricating a photovoltaic element according to the third aspect, as hereinabove described, the first transparent conductive film including the first indium oxide layer having (222) orientation and two X-ray diffraction peaks and the second transparent conductive film including the second indium oxide layer having (222) orientation and one X-ray diffraction peak are formed, whereby warping can be inhibited from occurring in the photovoltaic element even in a case where the temperature of the photovoltaic element is increased by light incidence, thereby allowing improvement of weather resistance. Consequently, the photovoltaic element capable of suppressing reduction in cell output (Pmax) after a lapse of a long time by the improvement of weather resistance can be fabricated.

In the aforementioned method of fabricating a photovoltaic element according to the third aspect, the step of forming the first transparent conductive film preferably includes a step of forming the first transparent conductive film by ion plating under a condition of an ion energy of at least 10 eV and not more than 20 eV, and the step of forming the second transparent conductive film preferably includes a step of forming the second transparent conductive film by ion plating under a condition of an ion energy of at least 10 eV and not more than 20 eV. According to this structure, damage to the photoelectric conversion layer due to ions can be reduced. Thus, it is possible to suppress reduction in weather resistance caused by damage to the photoelectric conversion layer due to ions.

In the aforementioned method of fabricating a photovoltaic element according to the third aspect, the step of forming the first transparent conductive film preferably includes a step of forming the first transparent conductive film by ion plating under a condition where the content of $WO_3$ powder in a target consisting of indium oxide ($In_2O_3$) is at least 1 percent by weight and not more than 3 percent by weight and a pressure of a gas mixture of Ar and $O_2$ is at least 0.7 Pa and not more than 1.0 Pa. According to this structure, the X-ray diffraction peaks of the first indium oxide layer can be easily constituted by the first peak on the low angle side and the second peak on the high angle side having the peak intensity level lower than the first peak, and the intensity ratio between the first peak and the second peak of the first indium oxide layer can be at least 1 and not more than 2.

In the aforementioned method of fabricating a photovoltaic element according to the third aspect, the step of forming the first transparent conductive film preferably includes a step of forming the first transparent conductive film prepared from a target consisting of indium oxide ($In_2O_3$) containing $SnO_2$ powder by ion plating under a condition where a pressure of a gas mixture of Ar and $O_2$ is at least 0.4 Pa and not more than 1.0 Pa. According to this structure, the X-ray diffraction peaks of the first indium oxide layer can be easily constituted by the first peak on the low angle side and the second peak on the high angle side having the peak intensity level lower than the first peak, and the intensity ratio between the first peak and the second peak of the first indium oxide layer can be at least 1 and not more than 2.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a diagram for illustrating the relation between pressures of a gas mixture of Ar and $O_2$ in forming second transparent conductive films on opposite sides to incidence sides respectively, and normalized weather resistance of photovoltaic elements.

DESCRIPTION OF THE PREFERRED EMBODIMENTS

Figure 1:
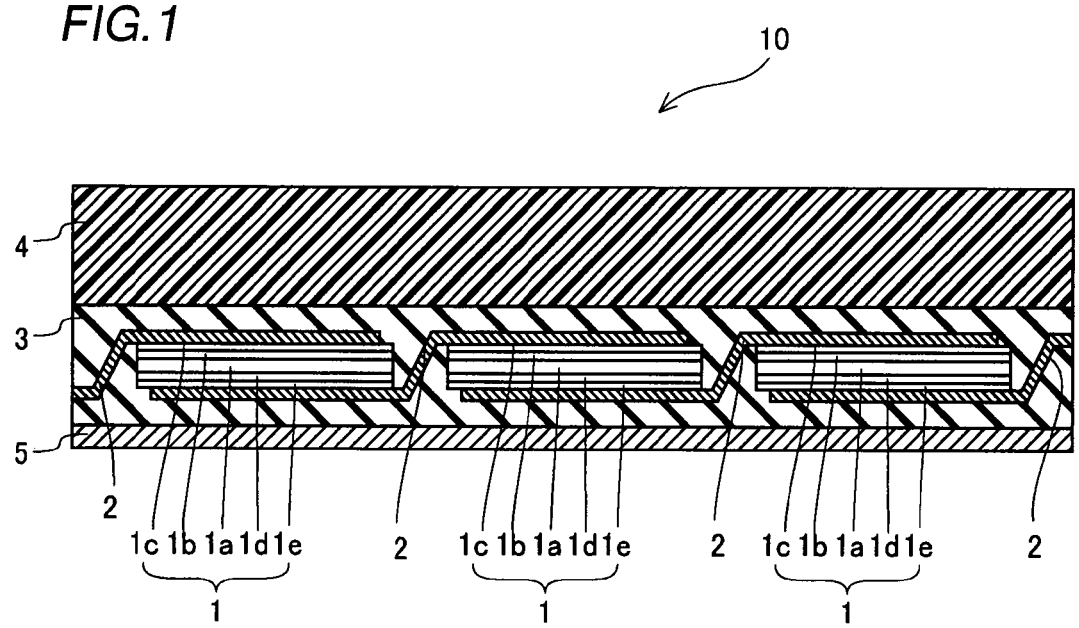
FIG. 1 is a sectional view showing a structure of a photovoltaic module comprising photovoltaic elements according to an embodiment of the present invention.

An embodiment of the present invention will be hereinafter described with reference to the drawings.

A structure of photovoltaic elements (not shown) according to the embodiment of the present invention will be now described. In each photovoltaic element 1 according to the embodiment of the present invention, a substantially intrinsic i-type amorphous silicon layer having a thickness of about 5 nm is formed on an upper surface of an n-type (100) single-crystalline silicon substrate (photoelectric conversion layer) (hereinafter referred to as "n-type single-crystalline silicon substrate") 1a having resistivity of about 1 Ω·cm and a thickness of about 300 μm. A p-type amorphous silicon layer having a thickness of about 5 nm is formed on the i-type amorphous silicon layer. The p-type amorphous silicon layer is an example of the "first semiconductor layer" in the present invention. A first transparent conductive film 1b consisting of a first indium oxide film having a thickness of about 100 nm is formed on the p-type amorphous silicon layer.

According to this embodiment, the first transparent conductive film 1b is formed by the first indium oxide film having (222) orientation and two X-ray diffraction peaks.

According to this embodiment, the two X-ray diffraction peaks of the first transparent conductive film 1b are constituted by a first peak (P1) on a low angle side having an angle 2θ (θ: X-ray diffraction angle) of 30.1±0.1 degrees and a second peak (P2) on a high angle side having a peak intensity level lower than the peak intensity level of the first peak (P1) and having an angle 2θ (θ: X-ray diffraction angle) of 30.6±0.1 degrees. The intensity ratio (P1/P2) between the first peak (P1) and the second peak (P2) is at least 1 and not more than 2.

A first collector 1c of silver (Ag) having a thickness of about 10 μm to about 30 μm is formed on a prescribed region of the upper surface of the first transparent conductive film 1b. This first collector is constituted by a plurality of finger electrode parts so formed as to extend in parallel with each other at a prescribed interval and a bus bar electrode part aggregating currents flowing in the finger electrode parts. The first collector 1c is an example of the "first Collector" in the present invention.

The substantially intrinsic i-type amorphous silicon layer having a thickness of about 5 nm is formed on a back surface of the n-type single-crystalline silicon substrate 1a. The n-type amorphous silicon layer having a thickness of about 5 nm is formed on a back surface of the i-type amorphous silicon layer. The n-type amorphous silicon layer is an example of the "second semiconductor layer" in the present invention. A second transparent conductive film 1d consisting of a second indium oxide film having a thickness of about 100 nm is formed on an back surface of the n-type amorphous silicon layer.

According to this embodiment, the second transparent conductive film 1d is formed by the second indium oxide film having (222) orientation and one X-ray diffraction peak having an angle $2\theta$ ($\theta$: X-ray diffraction angle) of 30.6±0.1 degrees.

A second collector 1e of silver (Ag) having a thickness of about 10 μm to about 30 μm is formed on a prescribed region of a back surface of the second transparent conductive film 1d. This second collector 1e is constituted by a plurality of finger electrode parts so formed as to extend in parallel with each other at a prescribed interval and a bus bar electrode part aggregating currents flowing in the finger electrode parts. The second collector 1e is an example of the "second collector" in the present invention.

FIG. 1 is a sectional view showing a structure of a photovoltaic module comprising photovoltaic elements according to an embodiment of the present invention. With reference to FIG. 1, a structure of a photovoltaic module 10 comprising the photovoltaic elements 1 according to the embodiment of the present invention will be now described. The photovoltaic module 10 according to the embodiment of the present invention comprises the plurality of photovoltaic elements 1 having the aforementioned structure, and each of these plurality of photovoltaic elements 1 is connected to another photovoltaic element 1 adjacent thereto through a tab electrode 2 folded in a stepped configuration. The photovoltaic elements 1 connected with each other through the tab electrodes 2 are sealed with a filler 3 consisting of EVA (Ethylene Vinyl Acetate) resin. A surface protector 4 consisting of glass for surface protection is arranged on an upper surface (incidence surface side) of the filler 3 sealing the plurality of photovoltaic elements 1. A back surface film 5 of a resin film such as PVF (Poly Vinyl Fluoride) film is arranged on a lower surface of the filler 3 sealing the plurality of photovoltaic elements 1. The first transparent conductive film 1b of each photovoltaic element 1 is arranged closer to a surface protector 4 on an incidence side, while the second transparent conductive film 1d is arranged closer to the back surface film 5 of an opposite side to the incidence side.

A process of fabricating the photovoltaic element 1 according to the embodiment of the present invention will be now described. First, the n-type single-crystalline silicon substrate 1a having resistivity of about 1 Ω·cm and a thickness of about 300 μm is cleaned, thereby removing impurities to form a texture structure (irregular configuration) by etching or the like. The i-type amorphous silicon layer and the p-type amorphous silicon layer are successively deposited on the n-type single-crystalline silicon substrate 1a with thicknesses of about 5 nm respectively by RF plasma CVD under a condition of a frequency of about 13.56 MHz, a formation temperature of about 100° C. to about 300° C., a reaction pressure of about 5 Pa to about 100 Pa, and RF power of about 1 mW/cm$^2$ to about 500 mW/cm$^2$, thereby forming a p-i-n junction. A group III element such as B, Al, Ga or In can be employed as a p-type dopant for forming the p-type amorphous silicon layer. The p-type amorphous silicon layer can be formed by mixing compound gas containing at least one of the aforementioned p-type dopants into material gas such as SiH$_4$ (silane) gas at a time of forming the p-type amorphous silicon layer.

The i-type amorphous silicon layer and the n-type amorphous silicon layer are successively deposited on the back surface of the n-type single-crystalline silicon substrate 1a with thicknesses of about 5 nm respectively. Thus, a BSF (back surface field) structure is formed. The i-type amorphous silicon layer and the n-type amorphous silicon layer are formed through a process similar to the aforementioned one for the i-type amorphous silicon layer and the p-type amorphous silicon layer closer to the incidence side, respectively. At this time, a group V element such as P, N, As or Sb can be employed as a dopant for forming the n-type amorphous silicon layer.

According to this embodiment, the first transparent conductive film 1b consisting of the first indium oxide film having a thickness of about 100 nm is formed on the p-type amorphous silicon layer by ion plating. More specifically, a target consisting of a sintered body of In$_2$O$_3$ powder containing about 1 percent by weight to about 5 percent by weight of WO$_3$ powder or SnO$_2$ powder for doping is set on a position facing a substrate in a chamber (not shown). In this case, the W content or the Sn content in the first indium oxide film can be varied by changing a quantity of the WO$_3$ powder or the SnO$_2$ powder. According to this embodiment, the first transparent conductive film 1b consisting of the first indium oxide film is formed on the p-type amorphous silicon layer by ion plating, whereby an ion energy in forming the first transparent conductive film 1b on the p-type amorphous silicon layer can be reduced to about 10 eV to about 20 eV. Accordingly, the ion energy can be considerably reduced, as compared with a case where the ion energy is 100 eV or more as in a case of forming the first transparent conductive film 1b by usual sputtering, for example. Thus, it is possible to reduce damages to the p-type amorphous silicon layer, the i-type amorphous silicon layer and the n-type single-crystalline silicon substrate 1a.

The chamber (not shown) is evacuated in a state of oppositely arranging the n-type single-crystalline silicon substrate 1a formed with the p-type amorphous silicon layer in parallel with the target. Thereafter a gas mixture of Ar and O$_2$ is fed for holding the pressure at about 0.4 Pa to about 1.0 Pa, thereby starting discharge. A partial pressure of Ar gas is maintained at about 0.36 Pa. In this case, a film forming rate is about 10 nm/min to about 80 nm/min in a state where the n-type single-crystalline silicon substrate 1a is stood still with respect to the target. The first transparent conductive film 1b consisting of the first indium oxide film is formed with the thickness of about 100 nm in the aforementioned manner, and the discharge is thereafter stopped.

According to this embodiment, the second transparent conductive film 1d consisting of the second indium oxide film having a thickness of about 100 nm is formed on the back surface of the n-type amorphous silicon layer by ion plating. The second transparent conductive film 1d of the second indium oxide film is formed through a process similar to the aforementioned one for the first transparent conductive film 1b of the first indium oxide film, except that the chamber is evacuated in a state where oppositely arranging the n-type amorphous silicon layer formed on the n-type single-crystalline silicon substrate in parallel with the target and thereafter a gas mixture of Ar and O$_2$ is fed for holding the pressure at about 1.3 Pa.

Then, Ag paste prepared by kneading impalpable silver (Ag) powder into epoxy resin is applied to the prescribed region of the upper surface of the first transparent conductive film 1b by screen printing to have a thickness of about 10 μm to about 30 μm and a width of about 100 μm to about 500 μm and thereafter fired at about 200° C. for about 80 minutes to be hardened, thereby forming the first collector consisting of the plurality of finger electrode parts so formed as to extend in parallel with each other at the prescribed interval and the bus bar electrode part aggregating the currents flowing in the finger electrode parts. After that, the second collector is formed on a lower surface of the second transparent conductive film through a process similar to the aforementioned one for the first collector.

With reference to FIG. 1, a process of fabricating the photovoltaic module 10 comprising the photovoltaic elements 1 according to the embodiment of the present invention will be now described. As shown in FIG. 1, a first end of the tab electrode 2 of copper foil is connected to the bus bar electrode part of the first collector of each of the plurality of photovoltaic elements 1 formed in the aforementioned manner. A second end of each tab electrode 2 is connected to the bus bar electrode part (not shown) of the second collector of adjacent photovoltaic element 1. Thus, the plurality of photovoltaic elements 1 are connected in series as shown in FIG. 1.

Then, an EVA sheet for forming the filler 3, the plurality of photovoltaic elements 1 connected by the tab electrodes 2 respectively, and the EVA sheet for forming the filler 3 are arranged between the surface protector 4 of glass and the resin film 5 in order from a side of the surface protector 4. At this time, the first transparent conductive film of each photovoltaic element 1 is arranged closer to the surface protector 4 of the incidence side. Thereafter a vacuum laminating process is performed while heating, thereby forming the photovoltaic module 10 according to this embodiment shown in FIG. 1.

According to this embodiment, as hereinabove described, the first transparent conductive film including the first indium oxide layer having (222) orientation and the two X-ray diffraction peaks is provided on a surface of the n-type single-crystalline silicon substrate closer to the incidence side while the second transparent conductive film including the second indium oxide layer having (222) orientation and the one X-ray diffraction peak is provided on the surface of the n-type single-crystalline silicon substrate opposite to the incidence side, whereby warping can be inhibited from occurring in the photovoltaic element 1 even in a case where the temperature of the photovoltaic elements 1 is increased by light incidence, thereby allowing improvement of weather resistance. Consequently, the photovoltaic elements 1 capable of suppressing reduction in cell output (Pmax) after a lapse of a long time by the improvement of weather resistance can be obtained.

A description will be now made of experiments made for confirming effects of the photovoltaic elements 1 according to this embodiment and the photovoltaic module 10 comprising the photovoltaic elements 1, with reference to FIGS. 2 to 7.

First, with reference to FIG. 2, a description will be made of an experiment for evaluation of the relation between pressures of a gas mixture of Ar and $O_2$ in forming first transparent conductive films closer the incidence sides respectively and X-ray diffraction spectra of the first transparent conductive films. In this experiment, samples according to Examples 1-1, 1-2 and 1-3 corresponding to the first transparent conductive films closer to the incidence side of this embodiment and a sample according to comparative example 1-1 were prepared, and X-ray diffraction spectra of the first transparent conductive films closer to the incidence sides respectively were measured as to the prepared samples.

As the sample according to Example 1-1, a target consisting of a sintered body of $In_2O_3$ powder containing about 1 percent by weight of $WO_3$ powder was employed for preparing a photovoltaic element formed on a p-type amorphous silicon layer formed on an n-type single-crystalline silicon substrate with a first transparent conductive film (IWO film) closer to an incidence side, having a thickness of about 100 nm by ion plating. At this time, the pressure of a gas mixture of Ar and $O_2$ was about 0.7 Pa, the partial pressure of Ar gas in the gas mixture was about 0.36 Pa. In order to excellently detect a signal of the X-ray diffraction spectrum, the n-type single-crystalline silicon substrate having a relatively flat front surface was employed. In the sample according to Example 1-1, a first collector closer to the incidence side, and an i-type amorphous silicon layer, an n-type amorphous silicon layer, a second transparent conductive film and a second collector on an opposite side to the incidence side (back surface side of the n-type single-crystalline silicon substrate) were not formed, and heat treatment was carried out at about 200° C. for about 80 minutes in consideration of heat treatment in forming the first and second collectors. The remaining structures of this sample according to Example 1-1 and a process of fabricating the same were similar to those of the photovoltaic element 1 according to the aforementioned embodiment. In the sample according to Example 1-2, a first transparent conductive film was formed at a pressure of a gas mixture of Ar and $O_2$ of about 1.0 Pa and a partial pressure of Ar gas in the gas mixture of about 0.36 Pa. In the sample according to Example 1-3, a first transparent conductive film was formed at a pressure of a gas mixture of Ar and $O_2$ of about 0.4 Pa and a partial pressure of Ar gas in the gas mixture of about 0.36 Pa. In a sample according to comparative example 1-1, a first transparent conductive film was formed at a pressure of a gas mixture of Ar and $O_2$ of about 1.3 Pa and a partial pressure of Ar gas in the gas mixture of about 0.36 Pa. Conditions other than the aforementioned conditions for preparing the samples according to Examples 1-2 and 1-3 and comparative example 1-1 were similar to those of the sample according to Example 1-1. Partial pressures of Ar gas in Examples 1-1, 1-2 and 1-3 and comparative example 1-1 (about 0.36 Pa) were the same. From this, it is shown that when the pressure of the gas mixture of Ar and $O_2$ is large, the content of oxygen ($O_2$) in the gas mixture is increased. X-ray diffraction spectra were measured as to these samples with an X-ray analyzer. Results thereof are shown in FIG. 2.

Figure 2:
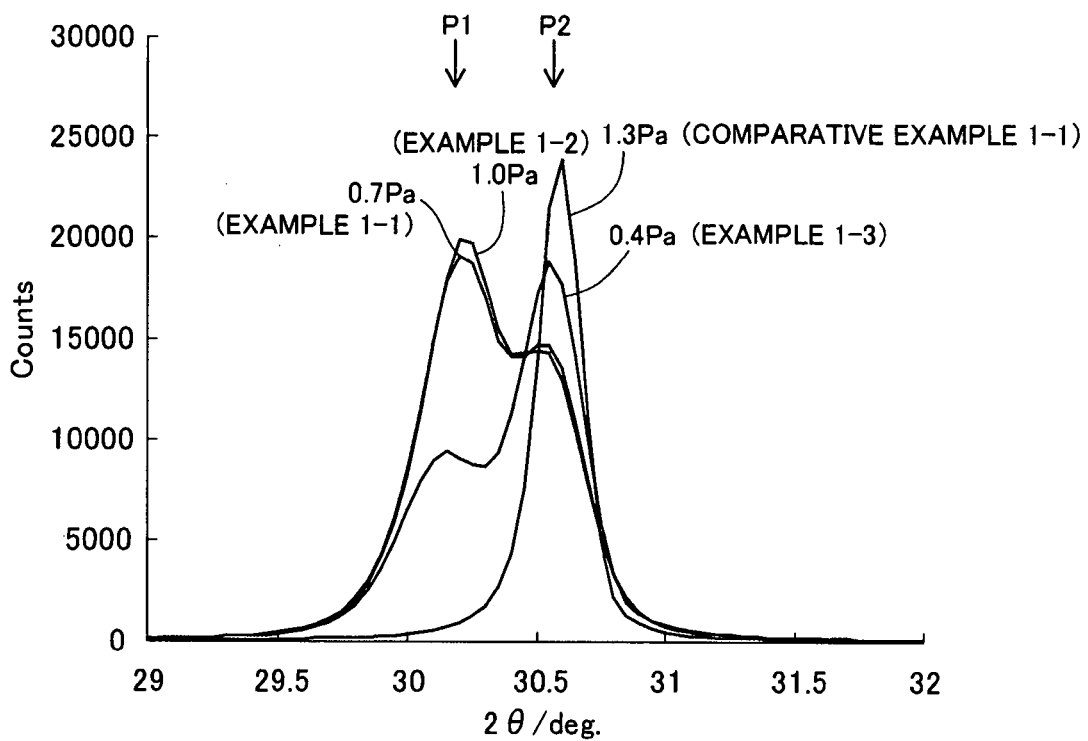
FIG. 2 is a diagram for illustrating the relation between pressures of a gas mixture of Ar and $O_2$ in forming first transparent conductive films closer to incidence sides respectively and X-ray diffraction spectra of the first transparent conductive films.

As shown in FIG. 2, it has been proved that the X-ray diffraction peak of the first transparent conductive film can be controlled by controlling the pressure of the gas mixture of Ar and $O_2$ in forming the first transparent conductive film closer to the incidence side. More specifically, the samples according to the Examples 1-1 and 1-2, in which the first transparent conductive films were formed at pressures of a gas mixture of Ar and $O_2$ of about 0.7 Pa and about 1.0 Pa respectively, have two peaks of a first peak (P1) on a low angle side having an angle 2θ (θ: X-ray diffraction angle) of 30.1±0.1 degrees and a second peak (P2) on a high angle side having a peak intensity level lower than the first peak (P1) and an angle 2θ (θ: X-ray diffraction angle) of 30.6±0.1 degrees. The sample according to Example 1-3, in which the first transparent conductive film was formed at a pressure of a gas mixture of Ar and $O_2$ of about 0.4 Pa, has two peaks of a first peak (P1) on a low angle having an angle 2θ (θ: X-ray diffraction angle) of 30.1±0.1 degrees and a second peak (P2) on a high angle side having a peak intensity level higher than the first peak (P1) and an angle 2θ (θ: X-ray diffraction angle) of 30.6±0.1 degrees. The sample according to comparative example 1-1, in which the first transparent conductive film was formed at a pressure of a gas mixture of Ar and $O_2$ of about 1.3 Pa, has only a peak with an angle $2\theta$ ($\theta$: X-ray diffraction angle) of $30.6\pm0.1$ degrees. The specific resistances of the first transparent conductive films of Examples 1-1, 1-2 and 1-3 and comparative example 1-1 were about $3\times10^{-4}$ ($\Omega\cdot$cm) to about $9\times10^{-4}$ ($\Omega\cdot$cm) (not shown). The specific resistance of comparative example 1-1, in which the first transparent conductive film was formed at a pressure of a gas mixture of Ar and $O_2$ of about 1.3 Pa, was smallest, and it has been shown that increase in the pressure of a gas mixture of Ar and $O_2$ tends to reduce the specific resistance of the first transparent conductive film.

Figure 3:
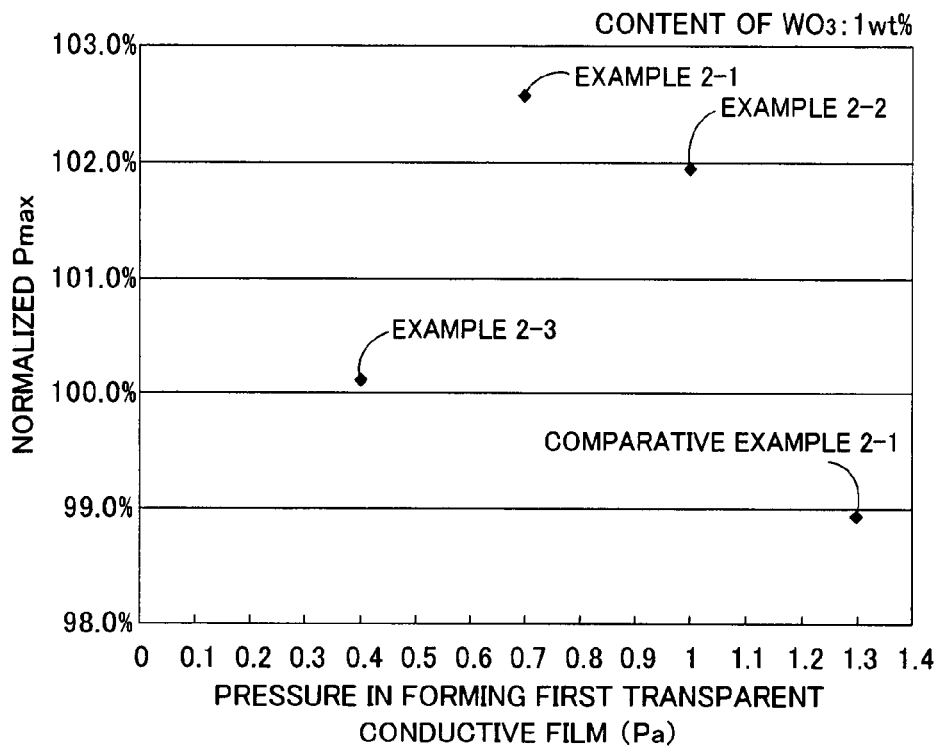
FIG. 3 is a diagram for illustrating the relation between pressures of a gas mixture of Ar and $O_2$ in forming first transparent conductive films closer to incidence sides respectively and normalized cell outputs (Pmax) of photovoltaic elements.

With reference to FIG. 3, results of evaluation of the relation between pressures of a gas mixture of Ar and $O_2$ in forming the first transparent conductive films closer to the incidence sides respectively and normalized cell outputs (Pmax) of the photovoltaic elements will be described. In this experiment, samples according to Examples 2-1, 2-2 and 2-3 corresponding to the first transparent film of this embodiment and a sample according to comparative example 2-1 were prepared and normalized cell outputs (Pmax) were measured as to the prepared samples.

In the samples according to Example 2-1, Example 2-2, Example 2-3 and comparative example 2-1, an n-type single-crystalline silicon substrate with a front surface formed thereon with a texture structure (irregular configuration) was employed, and a first collector and a second collector were formed on an upper surface of a first transparent conductive film (IWO film) closer to an incidence side and a lower surface of the n-type single-crystalline silicon substrate, respectively, dissimilarly to the samples according to the aforementioned Example 1-1, Example 1-2, Example 1-3 and comparative example 1-1. The remaining structures of the samples according to Example 2-1, Example 2-2, Example 2-3 and comparative example 2-1 and processes of fabricating the IWO films were similar to those of the samples according to the aforementioned Example 1-1, Example 1-2, Example 1-3 and comparative example 1-1, respectively. More specifically, a pressure of a gas mixture of Ar and $O_2$ was about 0.7 Pa in Example 2-1, a pressure of a gas mixture of Ar and $O_2$ was about 1.0 Pa in Example 2-2, and a pressure of a gas mixture of Ar and $O_2$ was about 0.4 Pa in Example 2-3. A pressure of a gas mixture of Ar and $O_2$ was about 1.3 Pa in comparative example 2-1. Thus, in the IWO films according to Examples 2-1 and 2-2, second peaks (P2) on high angle sides having peak intensity levels lower than the first peaks (P1) on low angle sides were obtained similarly to Examples 1-1 and 1-2 shown in FIG. 2, respectively. In the IWO film according to Example 2-3, a second peak (P2) on a high angle side having a peak intensity level higher than a first peak (P1) on a low angle side was obtained similarly to Example 1-3 shown in FIG. 2. In the IWO film according to comparative example 2-1, only one peak (P2) was obtained similarly to comparative example 1-1 shown in FIG. 2. Cell outputs (Pmax) were measured as to these samples according to Example 2-1, Example 2-2, Example 2-3 and comparative example 2-1, and the cell outputs (Pmax) were normalized. Results of these are shown in FIG. 3.

The cell outputs (Pmax) were normalized based on the cell outputs (Pmax) by a normalized photovoltaic element comprising a transparent conductive film closer to an incidence side, consisting of an ITO film having two peaks of a first peak (P1) on a low angle side of an angle $2\theta$ ($\theta$: X-ray diffraction angle) of $30.1\pm0.1$ degrees and a second peak (P2) on a high angle side having a peak intensity level higher than the first peak (P1) and an angle $2\theta$ ($\theta$: X-ray diffraction angle) of $30.6\pm0.1$ degrees. In the normalized photovoltaic element, a target consisting of a sintered body of $In_2O_3$ powder containing about 5 percent by weight of $SnO_2$ powder was employed by DC sputtering for forming a first transparent conductive film (ITO film). Forming conditions of the first transparent conductive film (ITO film) by DC sputtering were a substrate temperature of 60° C., an Ar flow rate of 200 sccm, a pressure of 0.5 Pa, DC power of 1 kW and a magnetic field of 2000 G applied to a cathode. The remaining structures of the normalized photovoltaic element and a process of fabricating the same are similar to the aforementioned Example 2-1.

As shown in FIG. 3, it has been proved that the cell outputs (Pmax) are increased in the samples according to Examples 2-1 and 2-2, each of which including the first transparent conductive film closer to the incidence side, consisting of an IWO film and having the second peak (P2) on the high angle side with the peak intensity level lower than the first peak (P1) on the low angle side, and the sample according to Example 2-3 having the second peak (P2) on the high angle side with the peak intensity level higher than the first peak (P1) on the low angle side, as compared with the sample according to comparative example 2-1 having only one peak (P2). More specifically, in samples according to Examples 2-1 and 2-2, each of which having the second peak (P2) on the high angle side with the peak intensity level lower than the first peak (P1) on the low angle side, the normalized cell outputs (Pmax) were about 102.7% and about 101.9%, respectively. In the sample according to Example 2-3 having the second peak (P2) on the high angle side with the peak intensity level higher than the first peak (P1) on the low angle side, the normalized cell outputs (Pmax) was about 100.1%. On the other hand, in the sample according to comparative example 2-1 having only one peak, the normalized cell outputs (Pmax) was about 98.9%. The reason that the normalized cell outputs (Pmax) of the sample according to comparative example 2-1 was less than 100% is conceivably that the sample according to comparative example 2-1 has only one peak while the normalized photovoltaic element has two peaks.

Figure 4:
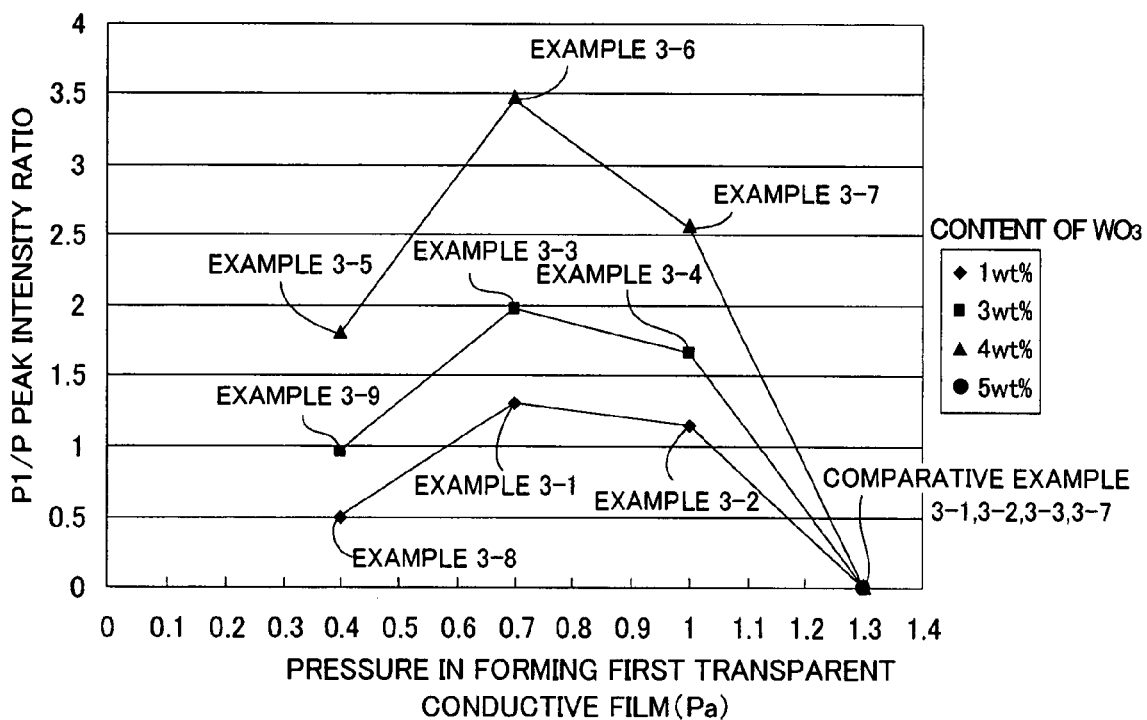
FIG. 4 is a diagram for illustrating the relation between pressures of a gas mixture of Ar and $O_2$ in forming first transparent conductive films closer to incidence sides respectively, the contents of $WO_3$ in targets, and intensity ratios (P1/P2) between first peaks (P1) and second peaks (P2) of the transparent conductive films.

With reference to FIG. 4, results of evaluation of the relation between pressures of a gas mixture of Ar and $O_2$ in forming first transparent conductive films closer to incidence sides respectively, the contents of $WO_3$ in targets, intensity ratios (P1/P2) between first peaks (P1) and second peaks (P2) of the first transparent conductive films will be described. In this experiment, samples according to Examples 3-1 to 3-9 corresponding to the first transparent conductive film of this embodiment and samples according to comparative examples 3-1 to 3-7 were prepared, X-ray diffraction spectra of the first transparent conductive films were measured as to the prepared samples, and the intensity ratios (P1/P2) between the first peaks (P1) and the second peaks (P2) of the first transparent conductive films were calculated.

As the sample according to Example 3-1, a target consisting of a sintered body of $In_2O_3$ powder containing about 1 percent by weight of $WO_3$ powder was employed for preparing a photovoltaic element formed on a p-type amorphous silicon layer with a first transparent conductive film (IWO film) closer to an incidence side, having a thickness of about 100 nm by ion plating. At this time, a pressure of a gas mixture of Ar and $O_2$ was about 0.7 Pa, a partial pressure of Ar gas in the gas mixture was about 0.36 Pa. In order to excellently detect a signal of the X-ray diffraction spectrum, an n-type single-crystalline silicon substrate having a relatively flat front surface was employed. In the sample according to Example 3-1, a first collector closer to the incidence side and an i-type amorphous silicon layer, an n-type amorphous silicon layer, a second transparent conductive film and a second collector on an opposite side to the incidence side (back surface side of the n-type single-crystalline silicon substrate) were not formed, and heat treatment was carried out at about 200° C. for about 80 minutes in consideration of heat treatment in forming the first and second collectors. The remaining structures of the sample according to Example 3-1 and a process of fabricating the same were similar to those of the photovoltaic element 1 according to the aforementioned embodiment. The samples according to Examples 3-2, 3-3, 3-4, 3-5, 3-6, 3-7, 3-8 and 3-9 were prepared from targets having the contents of $WO_3$ powder of about 1 percent by weight, about 3 percent by weight, about 3 percent by weight, about 4 percent by weight, about 4 percent by weight, about 4 percent by weight, about 1 percent by weight and about 3 percent by weight respectively. The samples according to Examples 3-2, 3-3, 3-4, 3-5, 3-6, 3-7, 3-8 and 3-9 were prepared at pressures of a gas mixture of Ar and $O_2$ of about 1.0 Pa, about 0.7 Pa, about 1.0 Pa, about 0.4 Pa, about 0.7 Pa, about 1.0 Pa, about 0.4 Pa and about 0.4 Pa, and partial pressures of Ar gas in the gas mixture of about 0.36 Pa, respectively. The samples according to comparative examples 3-1, 3-2, 3-3, 3-4, 3-5, 3-6 and 3-7 were prepared from targets having the contents of $WO_3$ powder of about 1 percent by weight, about 3 percent by weight, about 4 percent by weight, about 5 percent by weight, about 5 percent by weight, about 5 percent by weight and about 5 percent by weight, respectively. The samples according to comparative examples 3-1, 3-2, 3-3, 3-4, 3-5, 3-6 and 3-7 were prepared at pressures of a gas mixture of Ar and $O_2$ of about 1.3 Pa, about 1.3 Pa, about 1.3 Pa, about 0.4 Pa, about 0.7 Pa about 1.0 Pa and about 1.3 Pa and partial pressures of Ar gas in the gas mixture of about 0.36 Pa, respectively. Conditions other than the aforementioned conditions for preparing the samples according to Examples 3-2 to 3-9 and comparative examples 3-1 to 3-7 were similar to those of the sample according to Example 3-1. X-ray diffraction spectra were measured as to these samples of Examples 3-1 to 3-9 and comparative examples 3-1 to 3-7 with an X-ray analyzer, and the intensity ratios (P1/P2) between the first peaks (P1) and the second peaks (P2) of the first transparent conductive films closer to the incidence sides respectively were measured. Results thereof are shown in FIG. 4.

As shown in FIG. 4, it has been proved that, when the content of $WO_3$ in the target is in a range of about 1 percent by weight to about 4 percent by weight, as the content of $WO_3$ is increased, the intensity ratio (P1/P2) between the first peak (P1) and the second peak (P2) of the first transparent conductive film is increased. In a case where pressures of a gas mixture of Ar and $O_2$ are set to about 0.7 Pa and about 1.0 Pa, the first peaks (P1) of the first transparent conductive films became larger than the second peaks (P2) in the samples (Examples 3-1, 3-2, 3-3, 3-4, 3-6 and 3-7) having the contents of $WO_3$ powder of about 1 percent by weight to about 4 percent by weight. In a case where a pressure of a gas mixture of Ar and $O_2$ is set to about 0.4 Pa, the first peaks (P1) of the first transparent conductive films became smaller than the second peaks (P2) in the samples (Examples 3-8 and 3-9) having the contents of $WO_3$ powder of about 1 percent by weight and about 3 percent by weight. On the other hand, it has been proved that, also in a case where a pressure of a gas mixture of Ar and $O_2$ is set to about 0.4 Pa, when the content of $WO_3$ powder in the target is set to about 4 percent by weight as Example 3-5, the first peak (P1) on the low angle side of the first transparent conductive film is larger than the second peak (P2) on the high angle side. In the samples according to comparative examples 3-1, 3-2, 3-3 and 3-7 prepared at pressures of a gas mixture of Ar and $O_2$ of about 1.3 Pa, only second peaks (P2) were seen. In the samples according to comparative examples 3-4 to 3-6 prepared from targets having the contents of $WO_3$ powder of about 5 percent by weight, the peak intensity levels of the second peaks (P2) were not seen and only first peaks (P1) were seen. Therefore, the intensity ratios (P1/P2) between the first peaks (P1) and the second peaks (P2) of the first transparent conductive films are not shown in FIG. 4.

Figure 5:
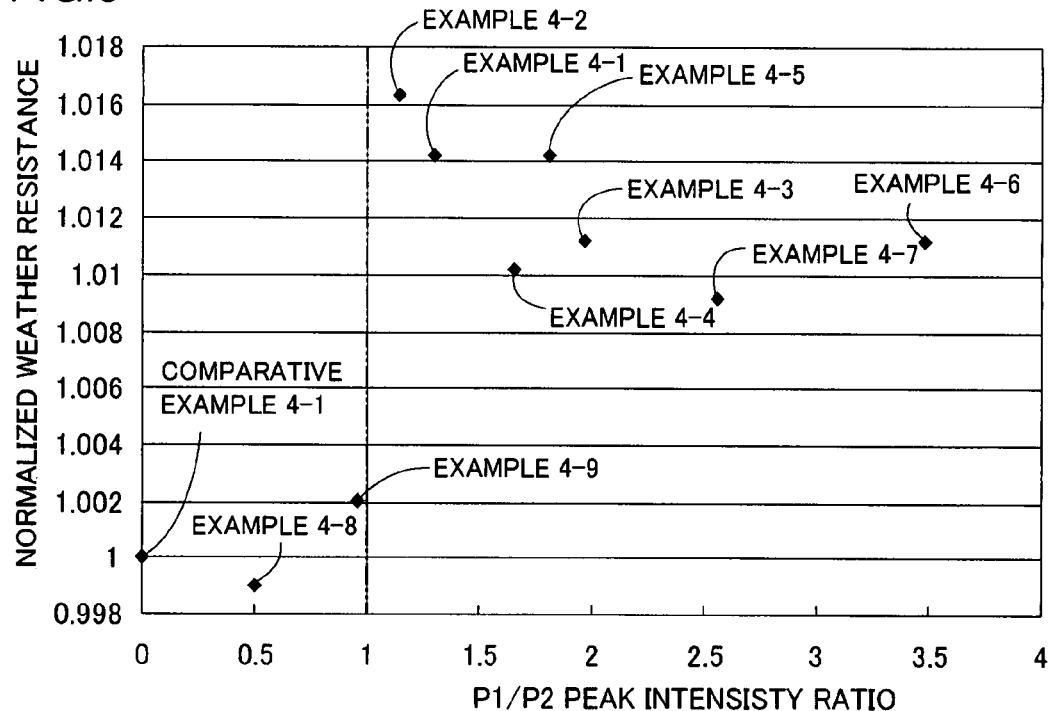
FIG. 5 is a diagram for illustrating the relation between intensity ratios (P1/P2) of first peaks (P1) and second peaks (P2) of first transparent conductive films closer to incidence sides respectively and normalized weather resistance of photovoltaic elements.

With reference to FIG. 5, results of evaluation of the relation between the intensity ratios (P1/P2) between first peaks (P1) and second peaks (P2) of first transparent conductive films closer to incidence sides respectively and normalized weather resistance of photovoltaic elements will be now described. In this experiment, samples according to Examples 4-1 to 4-9 corresponding to the first transparent conductive film closer to the incidence side of this embodiment and a sample according to comparative example 4-1 were prepared.

An n-type single-crystalline silicon substrate with a surface formed thereon with a texture structure (irregular configuration) was employed for the samples according to Examples 4-1 to 4-9 and comparative example 4-1 dissimilarly to the samples according to the aforementioned Examples 3-1 to 3-9 and comparative example 3-1, and first and second collectors were formed on an upper surface of a first transparent conductive film (IWO film) closer to an incidence side and a lower surface of an n-type single-crystalline silicon substrate, respectively. The remaining structures of the samples according to Examples 4-1 to 4-9 and comparative example 4-1 and processes of fabricating the IWO films were similar to those of the samples according to the aforementioned Examples 3-1 to 3-9 and comparative example 3-1. Photovoltaic modules including photovoltaic elements according to Examples 4-1 to 4-9 and comparative example 4-1 were prepared by employing a fabricating process similar to the photovoltaic module 10 according to the aforementioned embodiment. In the samples according to Examples 4-1 to 4-9 and comparative example 4-1, acceleration tests were carried out by employing a high permeable PVF film as a back surface film 5. The acceleration tests were carried out under a condition of a humidity of 85% and a temperature of 85° C. for 2000 hours. Cell outputs (Pmax) were measured before and after the acceleration tests, and weather resistance was calculated by dividing the cell output (Pmax) after the acceleration test by the cell output (Pmax) before the acceleration test for normalizing weather resistance. Results thereof are shown in FIG. 5. Weather resistance was normalized based on the sample according to comparative example 4-1 including only a peak having an angle 2θ (θ: X-ray diffraction angle) of 30.6±0.1 degrees.

As shown in FIG. 5, it has been proved that weather resistance is improved in the samples according to Examples 4-1 to 4-7, in which the first transparent conductive films consist of IWO films and the intensity ratios (P1/P2) between first peaks (P1) and second peaks (P2) of the first transparent conductive films are more than 1, as compared with the samples according to Examples 4-8 and 4-9, in which the intensity ratios (P1/P2) between first peaks (P1) and second peaks (P2) of the first transparent conductive films are less than 1, and the sample according to comparative example 4-1 having only one peak. This is conceivably for the following reason: In Examples 4-1 to 4-7, the first transparent conductive film is formed on the p-type amorphous silicon layer by ion plating when forming the first transparent conductive film, whereby an ion energy in forming the first transparent conductive film can be reduced to about 10 eV to about 20 eV.

Therefore, damage to the p-type amorphous silicon layer, the i-type amorphous silicon layer and the n-type single-crystalline silicon substrate due to ions can be reduced. Thus, reduction in weather resistance caused by the damage to the p-type amorphous silicon layer, the i-type amorphous silicon layer and the n-type single-crystalline silicon substrate due to ions can be conceivably suppressed. Additionally, in Examples 4-1 to 4-7, the first transparent conductive film is formed under a condition where the rearrangement of a deposited material is facilitated like a method such as ion plating, whereby the precision of the first transparent conductive film can be conceivably improved. It has been proved that there is not significant difference between the samples according to Examples 4-8 and 4-9, in which the intensity ratios (P1/P2) between the first peaks (P1) and the second peaks (P2) of the first transparent conductive films are less than 1, and the sample according to comparative example 4-1 having one peak. The reason of this is conceivably that the precision of the first transparent conductive film was not improved in the samples according to Examples 4-8 and 4-9, in which the intensity ratios (P1/P2) between the first peaks (P1) and the second peaks (P2) of the first transparent conductive films are less than 1, dissimilarly to the samples of Examples 4-1 to 4-7, in which the intensity ratios (P1/P2) between the first peaks (P1) and the second peaks (P2) of the first transparent conductive films are more than 1, although detailed mechanism is not known.

In the samples according to Examples 4-1 to 4-7 in which the intensity ratios (P1/P2) between the first peaks (P1) and the second peaks (P2) of the first transparent conductive films are more than 1, normalized weather resistance was about 100.92% to about 101.63%. In the samples according to Examples 4-8 and 4-9, in which the intensity ratios (P1/P2) between the first peaks (P1) and the second peaks (P2) of the first transparent conductive films are less than 1, normalized weather resistance was about 99.90% and about 100.20%, respectively. From the above, in order to improve weather resistance of the photovoltaic element, it is conceivably desirable that the intensity ratio (P1/P2) between the first peak (P1) and the second peak (P2) of the first transparent conductive film closer to the incidence side is at least 1.

Figure 6:
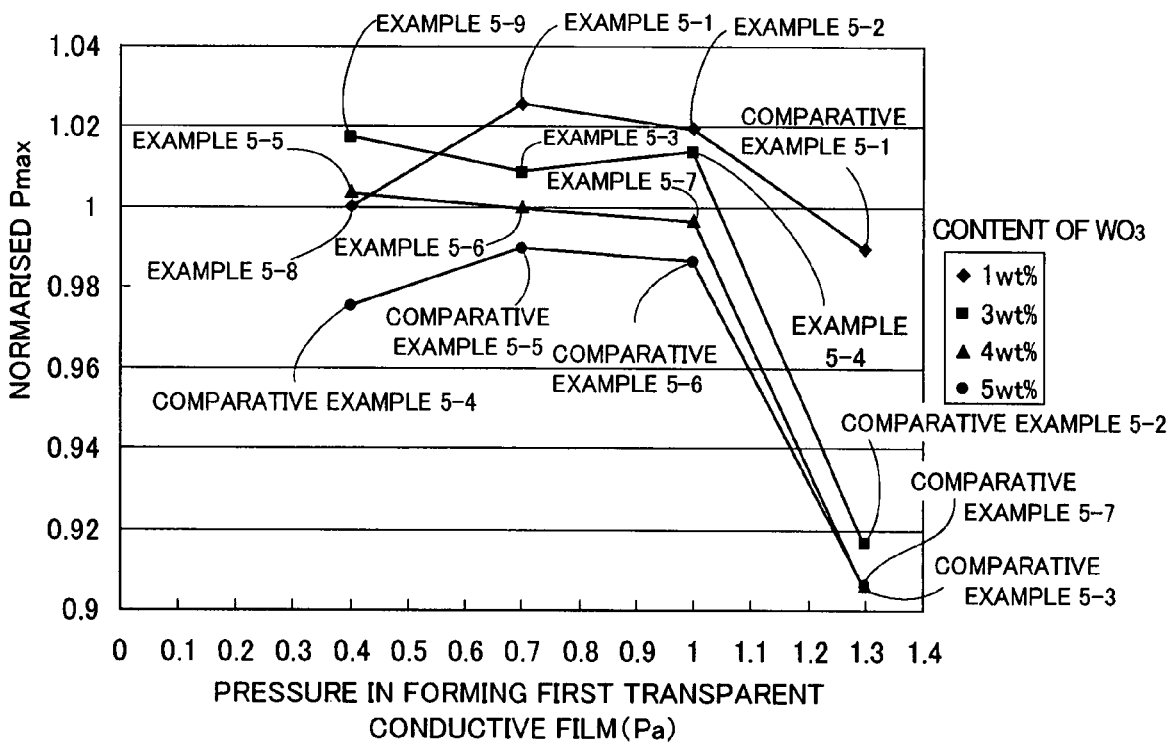
FIG. 6 is a diagram for illustrating the relation between pressures of a gas mixture of Ar and $O_2$ in forming first transparent conductive films closer to incidence sides respectively, the contents of $WO_3$ in targets, and normalized cell outputs (Pmax) of photovoltaic elements.

With reference to FIG. 6, results of evaluation of the relation between pressures of a gas mixture of Ar and $O_2$ in forming first transparent conductive films closer to incidence sides respectively the contents of $WO_3$ in targets and normalized cell outputs (Pmax) of the photovoltaic elements will be described. In this experiment, samples according to Examples 5-1 to 5-9 corresponding to the first transparent conductive film of this embodiment and samples according to comparative examples 5-1 to 5-7 were prepared, and cell outputs (Pmax) were measured as to the prepared samples.

An n-type single-crystalline silicon substrate with a surface formed thereon with a texture structure (irregular configuration) was employed for the samples according to Examples 5-1 to 5-9, and comparative examples 5-1 to 5-7 dissimilarly to the samples according to the aforementioned Examples 3-1 to 3-9 and comparative examples 3-1 to 3-7, and first and second collectors were formed on an upper surface of a first transparent conductive film (IWO film) closer to an incidence side and a lower surface of an n-type single-crystalline silicon substrate, respectively. The remaining structures of the samples according to Examples 5-1 to 5-9 and comparative examples 5-1 to 5-7 and processes of fabricating the IWO films were similar to those of the samples according to the aforementioned Examples 3-1 to 3-9 and comparative examples 3-1 to 3-7, respectively. Cell outputs (Pmax) were measured as to these samples and normalized.

Results thereof are shown in FIG. 6. The cell outputs (Pmax) were normalized based on the cell output (Pmax) by the same normalized photovoltaic element as that used when calculating the normalized cell outputs (Pmax) of Examples 2-1, 2-2 and 2-3 and comparative example 2-1 shown in FIG. 3.

As shown in FIG. 6, it has been proved that the cell output (Pmax) of the photovoltaic element tends to be reduced, as the content of $WO_3$ powder in the target is increased. This is conceivably for the following reason: The specific resistance of the first transparent conductive film can be reduced as the content of $WO_3$ in the target is increased, while W in the first transparent conductive film is increased, whereby light transmittance is reduced more than the decreasing rate of the specific resistance of the first transparent conductive film. In Examples 5-1 to 5-4, 5-8 and 5-9, in which the contents of $WO_3$ in the targets were 1 percent by weight or 3 percent by weight under a condition where pressures of a gas mixture of Ar and $O_2$ were about 0.4 Pa to about 1.0 Pa, the normalized cell outputs (Pmax) thereof were 1 or more. The normalized cell outputs (Pmax) thereof were 1 or more in Examples 5-5 and 5-6 having the contents of $WO_3$ in the targets of 4 percent by weight, while the normalized cell outputs (Pmax) thereof was less than 1 in Example 5-7. In comparative examples 5-4 to 5-7 having the contents of $WO_3$ in the targets of 5 percent by weight, the normalized cell outputs (Pmax) thereof were less than 1. In comparative examples 5-1, 5-2, 5-3 and 5-7 having pressures of a gas mixture of Ar and $O_2$ of about 1.3 Pa when the contents of $WO_3$ in the targets were in the range of about 1 percent by weight to about 5 percent by weight, the normalized cell outputs (Pmax) thereof were less than 1.

The intensity ratios (P1/P2) between the first peaks (P1) and the second peaks (P2) of the first transparent conductive films according to the aforementioned Examples 3-1 to 3-4, 3-8 and 3-9 having the same structure as Examples 5-1 to 5-4, 5-8 and 5-9 in which the contents of $WO_3$ in the targets having the normalized cell outputs (Pmax) of 1 or more were 1 percent by weight or 3 percent by weight, and fabricated by the same process as Examples 5-1 to 5-4, 5-8 and 5-9 were 2 or less as shown in FIG. 4. From the above, in order to improve the cell output (Pmax) of the photovoltaic element, it is conceivably desirable that the intensity ratio (P1/P2) between the first peak (P1) and the second peak (P2) of the first transparent conductive film is not more than 2.

A description will be made of results of evaluation of the relation between the intensity ratios (P1/P2) between first peaks (P1) and second peaks (P2) of transparent conductive films closer to incidence sides respectively, consisting of ITO films, dissimilarly to the first transparent conductive films closer to the incidence sides, consisting of the IWO films shown in FIGS. 2 to 6, and normalized weather resistance of the photovoltaic elements. In this experiment, a sample according to Example 6-1 corresponding to the first transparent conductive film of this embodiment was prepared and a cell output (Pmax) was measured as to the prepared sample.

As the sample according to Example 6-1, a target consisting of a sintered body of $In_2O_3$ powder containing about 3 percent by weight of $SnO_2$ powder was employed for preparing a photovoltaic element formed on a p-type amorphous silicon layer with a first transparent conductive film (ITO film) of about 100 nm in thickness by ion plating. The remaining structures of the photovoltaic element and a process of fabricating the same are similar to those of the photovoltaic element according to the aforementioned Example 4-1. A photovoltaic module including the photovoltaic element according to Example 6-1 was prepared by employing a fabricating process similar to the photovoltaic module 10 according to the aforementioned embodiment. In the sample according to Example 6-1, an acceleration test was carried out by employing a high permeable PVF film as a back surface film 5. The acceleration test was carried out under a condition of a humidity of 85% and a temperature of 85° C. for 2000 hours. Cell outputs (Pmax) were measured before and after the acceleration test, and weather resistance was calculated by dividing the cell output (Pmax) after the acceleration test by the cell output (Pmax) before the acceleration test for normalizing weather resistance. The intensity ratio (P1/P2) between the first peak (P1) and the second peak (P2) of the first transparent conductive film in the sample according to Example 6-1 was about 1.3. The normalized weather resistance of the sample according to Example 6-1 was 1.012. From these, it has been proved that the intensity ratio (P1/P2) between the first peak (P1) and the second peak (P2) of the first transparent conductive film can be 1 or more by ion plating even in a case where the first transparent conductive film is formed of an ITO film, and weather resistance can be improved not only in a case of the first transparent conductive film consisting of an IWO film but also in a case of the transparent conductive film consisting of an ITO film.

Weather resistance was normalized by a normalized photovoltaic module in which the intensity ratio (P1/P2) of a first peak (P1) and a second peak (P2) of the first transparent conductive film is about 0.5. In the normalized photovoltaic module, the first transparent conductive film (ITO film) was formed by employing a target consisting of a sintered body of $In_2O_3$ powder containing about 5 percent by weight of $SnO_2$ powder by DC sputtering. Forming conditions of the first transparent conductive film (ITO film) by DC sputtering were a substrate temperature of 60° C., an Ar flow rate of 200 sccm, a pressure of 0.5 Pa, DC power of 1 kW and a magnetic field of 2000 G applied to a cathode. The remaining structures of the normalized photovoltaic module and a process of fabricating the same are similar to those of the photovoltaic module according to the aforementioned Example 6-1.

With reference to FIG. 7, results of evaluation of the relation between pressures of a gas mixture of Ar and $O_2$ in forming second transparent conductive films on opposite sides to incidence sides (back surface sides of n-type single-crystalline silicon substrates) respectively, and normalized weather resistance of photovoltaic elements will be described. In this experiment, samples according to Example 7-1 corresponding to this embodiment and samples according to comparative examples 7-1 and 7-2 were prepared.

As samples according to Example 7-1, and comparative examples 7-1 and 7-2, each target consisting of a sintered body of $In_2O_3$ powder containing about 1 percent by weight of $WO_3$ powder was employed for preparing a photovoltaic element 1 formed with a first transparent conductive film (IWO film) of about 100 nm in thickness on a p-type amorphous silicon layer by ion plating. At this time, a pressure of a gas mixture of Ar and $O_2$ was about 0.7 Pa, a partial pressure of Ar gas in the gas mixture was about 0.36 Pa. In other words, each first transparent conductive film, in which an angle 2θ (θ: X-ray diffraction angle) has two peaks and an intensity ratio (P1/P2) between a first peak (P1) and a second peak (P2) of the first transparent conductive film is more than 1, was formed. In the sample according to Example 7-1, a second transparent conductive film (IWO film) located on an opposite side to an incidence side, having a thickness of about 100 nm was formed on a back surface of an n-type amorphous silicon layer by ion plating, by employing a target consisting of a sintered body of $In_2O_3$ powder containing about 1 percent by weight of $WO_3$ powder. At this time, a pressure of a gas mixture of Ar and $O_2$ was about 1.3 Pa, a partial pressure of Ar gas in the gas mixture was about 0.36 Pa. In other words, in Example 7-1, the second transparent conductive film having only a peak with an angle 2θ (θ: X-ray diffraction angle) of 30.6±0.1 degrees was formed. In the sample according to comparative example 7-1, the pressure of a gas mixture of Ar and $O_2$ in forming a second transparent conductive film was about 0.7 Pa, the partial pressure of Ar gas in the gas mixture was about 0.36 Pa. In other words, in comparative example 7-1, the second transparent conductive film, in which an angle 2θ (θ: X-ray diffraction angle) has two peaks and an intensity ratio (P1/P2) between a first peak (P1) and a second peak (P2) is more than 1, was formed. In the sample according to comparative example 7-2, the pressure of a gas mixture of Ar and $O_2$ in forming a second transparent conductive film was about 0.4 Pa, the partial pressure of Ar gas in the gas mixture was about 0.36 Pa. In other words, in comparative example 7-2, the second transparent conductive film, in which an angle 2θ (θ: X-ray diffraction angle) has two peaks and an intensity ratio (P1/P2) between a first peak (P1) and a second peak (P2) is less than 1, was formed. A photovoltaic module including the photovoltaic element 1 according to Example 7-1, and comparative examples 7-1 and 7-2 was prepared by employing a fabricating process similar to the photovoltaic module 10 according to the aforementioned embodiment. In the samples according to Example 7-1, comparative examples 7-1 and 7-2, each acceleration test was carried out by employing a high permeable PVF film as a back surface film 5. The acceleration test was carried out under a condition of a humidity of 85% and a temperature of 85° C. for 2000 hours. Cell outputs (Pmax) were measured before and after the acceleration test, and weather resistance was calculated by dividing the cell output (Pmax) after the acceleration test by the cell output (Pmax) before the acceleration test for normalizing weather resistance. Results thereof are shown in FIG. 7. Weather resistance was normalized based on the sample according to comparative example 7-1.

As shown in FIG. 7, it has been proved that weather resistance is improved in the sample according to Example 7-1 formed with the second transparent conductive film located on the opposite side to the incidence side, having only a peak with an angle 2θ (θ: X-ray diffraction angle) of 30.6±0.1 degrees, as compared with the samples according to comparative examples 7-1 and 7-2 formed with the second transparent conductive films in which the angle 2θ (θ: X-ray diffraction angle) has two peaks. This is conceivably for the following reason: In Example 7-1, the second transparent conductive film having only a peak with an angle 2θ (θ: X-ray diffraction angle) of 30.6±0.1 degrees is formed closer to the high permeable PVF film, whereby moisture entering through crystal gain boundary can be suppressed by inhibiting the crystal gain boundary from generating in the second transparent conductive film as compared with a case where a second transparent conductive film in which the angle 2θ (θ: X-ray diffraction angle) has two peaks is formed closer to the high permeable PVF film. Thus, it is conceivably possible to improve weather resistance with respect to moisture entering through the high permeable PVF film on the back side.

Results of evaluation of the relation between pressures of a gas mixture of Ar and $O_2$ in forming second transparent conductive films on opposite sides to incidence sides respectively and warping of photovoltaic elements due to heating will be described. In this experiment, a sample according to Example 8-1 corresponding to this embodiment and a sample according to comparative example 8-1 were prepared.

The samples according to Example 8-1 and comparative example 8-1 are similar to the photovoltaic elements 1 according to the aforementioned Example 7-1 and comparative example 7-1, respectively. The samples according to Example 8-1 and comparative example 8-1 each have a square shape with a length of 104 mm of each side in plan view. In an actual use environment, it is conceivable that temperature rise by light irradiation occurs in a first transparent conductive film closer to an incidence side, while temperature rise by light irradiation is unlikely to occur in a second transparent conductive film located on an opposite side to an incidence side since incident light is blocked by a photovoltaic element 1. In order to recreate difference between these temperatures, heating tests were carried out with respect to the samples according to Example 8-1 and comparative example 8-1 using a hot plate. The heating tests were carried out under a condition of a temperature of 150° C. for 20 minutes placing with first transparent conductive film sides down on a hot plate. Then, warping of the photovoltaic elements 1 after heating was observed. In the sample according to Example 8-1, warping did not appear in the photovoltaic element 1. On the other hand, in the sample according to comparative example 8-1, warping with 1 mm to 2 mm in the photovoltaic element 1 was confirmed. Accordingly, also in the actual use environment, warping is conceivably unlikely to occur in the photovoltaic elements 1 of the sample according to Example 8-1, while warping is conceivably likely to occur in the photovoltaic elements 1 of the sample according to comparative example 8-1. This is conceivably for the following reason: In comparative example 8-1 in which the first transparent conductive film and the second transparent conductive film in which an angle 2θ (θ: X-ray diffraction angle) has two peaks were formed closer to the incidence side and on the opposite side to the incidence side respectively, an amount of expansion of the first transparent conductive film due to the temperature rise is greater than an amount of expansion of the second transparent conductive film due to the temperature rise resulting from greater temperature rise in the first transparent conductive film closer to the incidence side by the light incidence as compared with the temperature rise in the second transparent conductive film by the light incidence. Thus, warping of the photovoltaic element 1 conceivably occurs on the second transparent conductive film side. On the other hand, in Example 8-1 in which the first transparent conductive film in which an angle 2θ (θ: X-ray diffraction angle) has two peaks was formed closer to the incidence side and the second transparent conductive film in which an angle 2θ (θ: X-ray diffraction angle) has one peak was formed on the opposite sides to the incidence side, also in a case where temperature rise in the first transparent conductive film closer to the incidence side due to the light incidence is greater as compared with the temperature rise in the second transparent conductive film due to the light incidence, the second transparent conductive film is likely to expand as compared with that in the first transparent conductive film, whereby difference between the amounts of expansion of the first transparent conductive film and the second transparent conductive film due to the temperature rise can be reduced. Thus, warping can be conceivably inhibited from occurring in the photovoltaic element 1. In Example 8-1, the warping can be thus inhibited from occurring in the photovoltaic element 1, whereby crack or peeling can be inhibited from occurring in each layer of the photovoltaic element 1. Thus, weather resistance of the photovoltaic element 1 can be conceivably improved.

Although the present invention has been described and illustrated in detail, it is clearly understood that the same is by way of illustration and example only and is not to be taken by way of limitation, the spirit and scope of the present invention being limited only by the terms of the appended claims.

For example, while the aforementioned embodiment has been described with reference to the case of employing a photoelectric conversion layer consisting of the n-type single-crystalline silicon substrate, the present invention is not restricted to this but similar effects can be attained also when employing a photoelectric conversion layer consisting of a p-type single-crystalline silicon substrate or an amorphous silicon layer.

While the i-type amorphous silicon layer, the p-type amorphous silicon layer and the first transparent conductive film are formed on a surface of the n-type single-crystalline silicon substrate, and the i-type amorphous silicon layer, the n-type amorphous silicon layer and the second transparent conductive film are formed on the back surface of the n-type single-crystalline silicon substrate in the aforementioned embodiment, the present invention is not restricted to this but similar effects can be attained also when employing a photovoltaic element not having the aforementioned structure as long as forming the first transparent conductive film closer to the incidence side while forming the second transparent conductive film on the opposite side to the incidence side. More specifically, the i-type amorphous silicon layer, the p-type amorphous silicon layer and the first transparent conductive film may be formed on a surface of the n-type single-crystalline silicon substrate while forming the second transparent conductive film on the back surface of the n-type single-crystalline silicon substrate.

While the aforementioned embodiment has been described with reference to the case of forming the transparent conductive film on the amorphous silicon layer, the present invention is not restricted to this but similar effects can be attained also when forming the transparent conductive film according to the present invention on a microcrystalline silicon layer, an amorphous SiC layer or an amorphous SiO layer.

While the indium oxide (IWO or ITO) film doped with W or Sn is employed as the material for constituting the transparent conductive film in the aforementioned embodiment, the present invention is not restricted to this but the transparent conductive film may alternatively consist of a material prepared from indium oxide doped with a material other than W or Sn. For example, the transparent conductive film may alternatively be doped with at least one of Ti, Zn, Ta and Re or combination of two or more of Ti, Zn, Ta and Re. For example, at least one of Ti, Sn and Zn may be doped in the transparent conductive film in addition to W.

While an ion energy in forming the transparent conductive film is reduced to about 10 eV to about 20 eV by ion plating for forming the transparent conductive film consisting of the indium oxide film in the aforementioned embodiment, the present invention is not restricted to this but the transparent conductive film consisting of the indium oxide film having the first peak (P1) on the low angle side and the second peak (P2) on the high angle side having the peak intensity level lower than the first peak (P1) may alternatively formed by a method other than ion plating, in which an ion energy in forming the transparent conductive film can be reduced to about 100 eV or less. For example, also when employing sputtering performed by RF sputtering on DC sputtering while applying a strong magnetic field, pulse modulation DC discharge, RF discharge, VHF discharge, microwave discharge, ion beam deposition or the like, and setting a forming condition where an ion energy in forming the transparent conductive film can be reduced to about 100 eV or less, the transparent conductive film consisting of the indium oxide film having the first peak (P1) on the low angle side and the second peak (P2) on the high angle side having the peak intensity level lower than the first peak (P1) can be formed. In this case, when the transparent conductive film consisting of the indium oxide film including (222) peak having two peaks is formed, effects similar to those of the present invention can be attained. It has been confirmed that, when employing sputtering performed by RF sputtering on DC sputtering while applying a strong magnetic field, the transparent conductive film is formed under a condition of a magnetic field of about 3000 G, DC power of 1.2 kW and RF power of 0.6 kW, whereby an ion energy in forming the transparent conductive film can be reduced to about 100 eV or less, and plasma damage to the semiconductor layer serving as an underlayer for the transparent conductive film can be suppressed. When employing sputtering performed by RF sputtering on DC sputtering while applying a strong magnetic field, pulse modulation DC discharge, RF discharge, VHF discharge, or microwave discharge, it is desirable that the transparent conductive film is formed at about 150° C. to about 200° C. in order to facilitate the rearrangement of a deposited material (W or Sn). When employing ion beam deposition, heating in forming a film may not be performed in a similar manner to the aforementioned embodiment employing ion plating.

While Ar gas is employed when forming the indium oxide film constituting the transparent conductive film in the aforementioned embodiment, the present invention is not restricted to this but another inert gas such as He, Ne, Kr or Xe or a gas mixture thereof can be alternatively employed.

While the i-type amorphous silicon layer and the p-type amorphous silicon layer are formed by RF plasma CVD in the aforementioned embodiment, the present invention is not restricted to this but the amorphous silicon layers may alternatively be formed by another method such as evaporation, sputtering, microwave plasma CVD, ECR, thermal CVD or LPCVD (low-pressure CVD).

While the aforementioned embodiment employs silicon (Si) as a semiconductor material, the present invention is not restricted to this but any semiconductor material selected from SiGe, SiGeC, SiC, SiN, SiGeN, SiSn, SiSnN, SiSnO, SiO, Ge, GeC and GeN may alternatively be employed. In this case, the selected semiconductor material may be a crystalline material or an amorphous or microcrystalline material containing at least either hydrogen or fluorine.

While one p-i-n structure is formed in the photovoltaic element in the aforementioned embodiment, the present invention is not restricted to this but a plurality of p-i-n structures are formed in the photovoltaic element by stack.

What is claimed is:

1. A photovoltaic element comprising:
a photoelectric conversion layer;
a first transparent conductive film formed on a surface of said photoelectric conversion layer closer to an incidence side and including a first indium oxide layer having (222) orientation and two X-ray diffraction peaks; and
a second transparent conductive film formed on a surface of said photoelectric conversion layer opposite to said incidence side and including a second indium oxide layer having (222) orientation and one X-ray diffraction peak,
wherein the first and second transparent conductive film layers are configured such that a temperature rise due to light incidence upon the first transparent conductive film is greater than that of the second transparent conductive film and a coefficient of thermal expansion of the second transparent conductive film is greater as compared with that of the first transparent conductive film.

2. The photovoltaic element according to claim 1, wherein said X-ray diffraction peak of said second indium oxide layer has an angle 2θ (θ : X-ray diffraction angle) in the vicinity of 30.6 degrees.

3. The photovoltaic element according to claim 1, wherein said two X-ray diffraction peaks of said first indium oxide layer are constituted by a first peak on a low angle side having an angle 2θ (θ X-ray diffraction angle) in the vicinity of 30.1 degrees, and a second peak on a high angle side with a peak intensity level lower than said first peak, having an angle 2θ (θ : X-ray diffraction angle) in the vicinity of 30.6 degrees.

4. The photovoltaic element according to claim 3, wherein, the intensity ratio between said first peak and said second peak of said first indium oxide layer is at least 1.

5. The photovoltaic element according to claim 4, wherein, the intensity ratio between said first peak and said second peak of said first indium oxide layer is at most 2.

6. The photovoltaic element according to claim 1, wherein said first indium oxide layer and said second indium oxide layer include W.

7. The photovoltaic element according to claim 1, further comprising:
a first semiconductor layer formed thereon with said first transparent conductive film and consisting of at least either an amorphous semiconductor or a microcrystalline semiconductor;
a first collector formed on a surface of said first transparent conductive film;
a second semiconductor layer formed thereon with said second transparent conductive film and consisting of at least either an amorphous semiconductor or a microcrystalline semiconductor; and
a second collector formed on a surface of said second transparent conductive film.

8. The photovoltaic element according to claim 1, wherein said first indium oxide layer and said second indium oxide layer include Sn.

9. A photovoltaic module comprising:
a photoelectric conversion layer;
a plurality of photovoltaic elements, each of which including a first transparent conductive film formed on a surface of said photoelectric conversion layer closer to an incidence side and including a first indium oxide layer having (222) orientation and two X-ray diffraction peaks, and a second transparent conductive film formed on a surface of said photoelectric conversion layer opposite to said incidence side and including a second indium oxide layer having (222) orientation and one X-ray diffraction peak;
a transparent surface protector arranged on a surface of said first transparent conductive film closer to said incidence side; and
a resin film arranged on a surface of said second transparent conductive film opposite to the incidence side,
wherein the first and second transparent conductive film layers are configured such that a temperature rise due to light incidence upon the first transparent conductive film is greater than that of the second transparent conductive film and a coefficient of thermal expansion of the second transparent conductive film is greater as compared with that of the first transparent conductive film.

10. The photovoltaic module according to claim 9, wherein said X-ray diffraction peak of said second indium oxide layer has an angle 2θ (θ : X-ray diffraction angle) in the vicinity of 30.6 degrees.

11. The photovoltaic module according to claim 9, wherein said two X-ray diffraction peaks of said first indium oxide layer are constituted by a first peak on a low angle side having an angle 2θ (θ : X-ray diffraction angle) in the vicinity of 30.1 degrees and a second peak on a high angle side with a peak intensity level lower than said first peak, having an angle 2θ (θ : X-ray diffraction angle) in the vicinity of 30.6 degrees.

12. The photovoltaic module according to claim 11, wherein,
the intensity ratio between said first peak and said second peak of said first indium oxide layer is at least 1.

13. The photovoltaic module according to claim 12, wherein,
the intensity ratio between said first peak and said second peak of said first indium oxide layer is at most 2.

14. The photovoltiac module according to claim 9, wherein said first indium oxide layer and said second indium oxide layer include W.

15. The photovoltaic module according to claim 9, further comprising:

a first semiconductor layer formed thereon with said first transparent conductive film and consisting of at least either an amorphous semiconductor or a microcrystalline semiconductor;

a first collector formed on a surface of said first transparent conductive film;

a second semiconductor layer formed thereon with said second transparent conductive film and consisting of at least either an amorphous semiconductor or a microcrystalline semiconductor; and a second collector formed on a surface of said second transparent conductive film.

16. The photovoltaic module according to claim 9, wherein said first indium oxide layer and said second indium oxide layer include Sn.

* * * * *